US007589355B2

(12) United States Patent
Tomoda et al.

(10) Patent No.: US 7,589,355 B2
(45) Date of Patent: Sep. 15, 2009

(54) LIGHT EMITTING DIODE, METHOD OF MANUFACTURING LIGHT EMITTING DIODE, LIGHT EMITTING DIODE BACKLIGHT, LIGHT EMITTING DIODE ILLUMINATING DEVICE, LIGHT EMITTING DIODE DISPLAY, AND ELECTRONIC APPARATUS

(75) Inventors: Katsuhiro Tomoda, Kanagawa (JP); Jun Suzuki, Kanagawa (JP); Masato Doi, Kanagawa (JP); Kensuke Kojima, Kanagawa (JP)

(73) Assignee: Sony Corporation, Tokyo (JP)

( * ) Notice: Subject to any disclaimer, the term of this patent is extended or adjusted under 35 U.S.C. 154(b) by 449 days.

(21) Appl. No.: 11/422,492

(22) Filed: Jun. 6, 2006

(65) Prior Publication Data

US 2006/0278886 A1 Dec. 14, 2006

(30) Foreign Application Priority Data

Jun. 10, 2005 (JP) ............................. 2005-170367
Apr. 19, 2006 (JP) ............................. 2006-115374

(51) Int. Cl.
*H01L 29/267* (2006.01)
*H01L 29/22* (2006.01)

(52) U.S. Cl. ........................... 257/98; 257/99; 257/100; 257/81; 257/95; 438/22

(58) Field of Classification Search ................... 257/98, 257/99, 81, 91, 95
See application file for complete search history.

(56) References Cited

U.S. PATENT DOCUMENTS

| 6,570,190 B2 * | 5/2003 | Krames et al. ................. 257/94 |
| 7,279,723 B2 * | 10/2007 | Matsumura et al. ......... 257/100 |
| 2003/0201451 A1 * | 10/2003 | Suehiro et al. ................. 257/98 |
| 2004/0076016 A1 * | 4/2004 | Sato et al. .................... 362/555 |

FOREIGN PATENT DOCUMENTS

JP 2002050792 2/2002

OTHER PUBLICATIONS

Casey, H. C. et al., Heterostructure Lasers, Part A, B, Academic Press, 1978, Fig. 7. 7-1 and the related explanations.

* cited by examiner

*Primary Examiner*—Kenneth A Parker
*Assistant Examiner*—Joseph Nguyen
(74) *Attorney, Agent, or Firm*—K&L Gates LLP

(57) ABSTRACT

A light emitting diode is provided. The light emitting diode includes a semiconductor layer that forms a light emitting diode structure and has a major face and an end face inclined at an angle $\theta_1$ to the major face, and a reflector that is provided outside the end face with being opposed to the end face, and includes at least a portion inclined at an angle $\theta_2$ to the major face, the angle $\theta_2$ being smaller than the angle $\theta_1$.

14 Claims, 16 Drawing Sheets

LIGHT EMITTING DIODE, METHOD OF MANUFACTURING LIGHT EMITTING DIODE, LIGHT EMITTING DIODE BACKLIGHT, LIGHT EMITTING DIODE ILLUMINATING DEVICE, LIGHT EMITTING DIODE DISPLAY, AND ELECTRONIC APPARATUS

CROSS REFERENCES TO RELATED APPLICATIONS

The present application claims priority to Japanese Patent Application JP 2005-170367 filed in the Japanese Patent Office on Jun. 10, 2005, and Japanese Patent Application JP 2006-115374 filed in the Japanese Patent Office on Apr. 19, 2006, the entire contents of which being incorporated herein by reference.

BACKGROUND

The present application relates to a light emitting diode, a method of manufacturing a light emitting diode, a light emitting diode backlight, a light emitting diode illuminating device, a light emitting diode display, and an electronic apparatus.

In the past, GaN-based light emitting diodes like one shown in FIG. 20 have been known. Referring to FIG. 20, in this GaN-based light emitting diode, an n-GaN layer 102, an active layer 103 and a p-GaN layer 104 are sequentially deposited over a sapphire substrate 101 to form a light emitting diode structure. In this structure, upper part of the n-GaN layer 102, the active layer 103 and the p-GaN layer 104 are patterned by etching into a pillar shape having an end face perpendicular to the substrate face. Furthermore, a p-electrode 105 is formed on the p-GaN layer 104 and an n-electrode 106 is formed on the n-GaN layer 102 outside the pillar-shaped part. In the operation of the GaN-based light emitting diode, light emanated from the active layer 103 repeats total reflection inside the pillar-shaped part and passes through the sapphire substrate 101, followed by being extracted to the outside finally.

As one related art, a technique has been proposed in Japanese Patent Laid-Open No. 2002-50792 for example. This patent discloses a semiconductor light emitting diode that includes an electrically conductive substrate, a semiconductor light emitting layer epitaxially grown on the conductive substrate, and a metal electrode on the opposite side of the conductive substrate across the semiconductor light emitting layer. In this diode, the metal electrode is disposed so that light emanated from the semiconductor light emitting layer is reflected by the metal electrode toward the external, and for example the metal electrode face is inclined at 45 degrees to the semiconductor light emitting layer. It however should be noted that this proposed diode is greatly different in the technical idea from light emitting diodes according to embodiments of the present invention, in which semiconductor layers constructing a light emitting diode structure have an end face inclined to the major face of the semiconductor layers, and a reflector opposed to the end face is provided.

In the conventional GaN-based light emitting diode shown in FIG. 20, since the end face of the pillar-shaped part formed of the n-GaN layer 102, the active layer 103 and the p-GaN layer 104 is perpendicular to the substrate face, light emanated from the active layer 103 in the operation of the diode repeats total reflection inside the pillar-shaped part, and is absorbed as the result thereof. This leads to low light extraction efficiency, which results in decreased emission efficiency. In addition, this GaN-based light emitting diode involves a drawback in that the diameter of the pillar-shaped part formed of the n-GaN layer 102, the active layer 103 and the p-GaN layer 104 is generally as large as about 300 µm, and therefore the total diode size is large.

Therefore, there is a need to provide a light emitting diode that allows a great improvement of the light extraction efficiency to thereby significantly enhance the emission efficiency, and can easily achieve a miniaturized size.

Moreover, there is a need to provide a light emitting diode backlight, a light emitting diode illuminating device, a light emitting diode display and an electronic apparatus that employ this excellent light emitting diode.

SUMMARY

The present inventors have made studies on a diode like one shown in FIG. 21 as a GaN-based light emitting diode that has a structure suitable for its size reduction and can ensure certain degree of light extraction efficiency. As shown in FIG. 21, in this GaN-based light emitting diode, an n-GaN layer 201, an active layer 202 and a p-GaN layer 203 that form a light emitting diode structure are dry-etched to thereby form an end face 204 inclined at e.g. about 45 degrees to the major faces of the layers 201 to 203. In addition, a p-electrode 205 is formed on the upper face of the p-GaN layer 203, and a transparent electrode composed of e.g. indium tin oxide (ITO) is formed as an n-electrode 206 on the lower face of the n-GaN layer 201. In this diode, for enhancement of the light extraction efficiency, light emanated from the active layer 202 is subjected to total reflection on the end face 204 so as to be directed toward the lower face of the n-GaN layer 201, i.e., the emitting plane.

However, the studies have revealed a problem of this GaN-based light emitting diode. Specifically, a large portion of light is actually leaked from the end face 204, and in particular when the GaN-based light emitting diode is sealed with a resin, about 60% of light emanated from the active layer 202 travels in the resin, which results in light loss. Accordingly, even when the reflectivity of the p-electrode 205 was enhanced and the inclination angle of the end face 204 was optimized, the obtained light extraction efficiency was as low as about 20% at most. FIG. 22 illustrates one example of the ratio of the amounts of light directed in the respective directions. FIG. 22 schematically illustrates the above-described GaN-based light emitting diode sealed with a resin.

Further studies have been made to address this problem, and the result thereof have revealed that it is effective to provide outside the end face 204 a reflector that directs light emitted from the end face 204 toward the light extraction plane. The present inventors therefore have made detailed studies based on this feature, and finally have reached the creation of ideas relating to embodiments of the present invention.

Another problem of the GaN-based light emitting diode shown in FIG. 21 is that it is difficult to ensure a favorable ohmic contact between the n-GaN layer 201 and the transparent electrode composed of ITO or the like used as the n-electrode 206. It therefore is desirable to use as the n-electrode 206 a metal that can ensure a favorable ohmic contact. However, such a metal is generally opaque. In the formation of such an opaque n-electrode 206 on the lower face of the n-GaN layer 201, i.e., on the light extraction plane, the formation position and size thereof have not been specifically studied before. However, the present inventors have made studies also on this respect, and have reached the creation of ideas relating to embodiments of the present invention.

Specifically, in order to solve the above-described problem, according to a first embodiment, there is provided a light emitting diode including a semiconductor layer that forms a light emitting diode structure and has a major face and an end face inclined at an angle $\theta_1$ to the major face, and a reflector that is provided outside the end face with being opposed to the end face, and includes at least a portion inclined at an angle $\theta_2$ smaller than the angle $\theta_1$ to the major face.

The semiconductor layer that forms a light emitting diode structure includes a first semiconductor layer of a first conductivity type, an active layer and a second semiconductor layer of a second conductivity type. The semiconductor layer typically has a circular planar shape. However, it may have any other planar shape according to need. For example, a shape arising from a regular or irregular deformation of all or part of a circle, such as an ellipse, is also available. Furthermore, an n-gon shape (n is an integer larger than 2), and a shape arising from a regular or irregular deformation of all or part of an n-gon shape are also available. The sectional shape of the semiconductor layer is typically a trapezoid, rectangle or inverted trapezoid. However, deformations thereof are also available. The inclination angle $\theta_1$ of the end face of the semiconductor layer is typically constant across the entire end face. However, it does not necessarily need to be so but may be varied from part to part in the end face. The maximum diameter of the semiconductor layer can be decided according to need. It is normally 50 µm or less, typically 30 µm or less, and more typically 25 µm or less.

As the material for the semiconductor layers that form a light emitting diode structure, specifically for the first semiconductor layer, the active layer and the second semiconductor layer, any semiconductor may be used basically, and either semiconductor of inorganic and organic semiconductors is available. For example, a semiconductor having a wurtzite crystal structure or a cubic structure can be used. Examples of the semiconductors having a wurtzite crystal structure include nitride-based III-V group compound semiconductors, II-VI group compound semiconductors such as BeMgZnCdS-based compound semiconductors and BeMgZnCdO-based compound semiconductors, and oxide semiconductors such as ZnO. The nitride-based III-V group compound semiconductor is most generally $Al_xB_yGa_{1-x-y-z}In_zAs_uN_{1-u-v}P_v$ ($0 \leq x \leq 1$, $0 \leq y \leq 1$, $0 \leq z \leq 1$, $0 \leq u \leq 1$, $0 \leq v \leq 1$, $0 \leq x+y+z<1$, $0 \leq u+v<1$), more specifically $Al_zB_yGa_{1-u-y-z}In_zN$ ($0 \leq x \leq 1$, $0 \leq y \leq 1$, $0 \leq z \leq 1$, $0 \leq x+y+z<1$), and typically $Al_xGa_{1-x-z}In_zN$ ($0 \leq x \leq 1$, $0 \leq z \leq 1$). Specific examples of the nitride-based III-V group compound semiconductors include GaN, InN, AlN, AlGaN, InGaN, and AlGaInN. Examples of the semiconductors having a cubic structure include AlGaInP-based semiconductors and AlGaAs-based semiconductors. The first conductivity type may be either type of n- and p-types, and correspondingly the second conductivity type is the p- or n-type.

Deposition of the first semiconductor layer, the active layer and the second semiconductor layer may employ, but not limited to, metalorganic chemical vapor deposition (MOCVD) or any of various epitaxial growth methods such as hydride vapor phase epitaxy, halide vapor phase epitaxy (HVPE) and molecular beam epitaxy (MBE). A substrate used for the deposition may be composed of any material basically as long as it allows the deposition of the first semiconductor layer, the active layer and the second semiconductor layer with a favorable crystallinity. Specifically, when the first semiconductor layer, the active layer and the second semiconductor layer are composed of a nitride-based III-V group compound semiconductor, a substrate composed of any of the following materials may be used: sapphire ($Al_2O_3$) (C-plane, A-plane, R-plane or a plane offset from these planes), SiC (6H, 4H or 3C), nitride-based III-V group compound semiconductors (GaN, InAlGaN, AlN etc.), Si, ZnS, ZnO, LiMgO, GaAs, $MgAl_2O_4$, etc. When the first semiconductor layer, the active layer and the second semiconductor layer are composed of an AlGaInP-based semiconductor or AlGaAs-based semiconductor, typically a GaAs substrate may be used.

According to a second embodiment, there is provided a method of manufacturing a light emitting diode. The method includes the steps of forming a semiconductor layer that forms a light emitting diode structure and has a major face and an end face inclined at an angle $\theta_1$ to the major face, and forming a transparent resin that covers at least the end face and has a refractive index smaller than the refractive index of the semiconductor layer. The transparent resin has an inclined face that includes at least a portion inclined at an angle $\theta_2$ smaller than the angle $\theta_1$ to the major face. The method also includes the step of forming a reflector that is provided outside the end face with being opposed to the end face with intermediary of the transparent resin therebetween, and includes at least a portion inclined at the angle $\theta_2$ to the major face.

The above descriptions related to the first embodiment also apply to the second embodiment as long as they do not contradict the nature of the second embodiment.

According to a third embodiment, there is provided a light emitting diode including a semiconductor layer that forms a light emitting diode structure and has a major face and an end face inclined to the major face, and a first electrode and a second electrode that are opaque and are formed on the semiconductor layer. The second electrode is provided on one face of the semiconductor layer. The first electrode is provided on a region other than a region overlapping with a light path in which the amount of light extracted from the semiconductor layer is large.

Specifically, when the plane on which the first electrode is to be provided is the light extraction plane for example, the first electrode, which is provided on a region other than a region overlapping with a light path in which the amount of light extracted from the semiconductor layer is large, is formed on a region other than the region obtained by projecting the end face of the semiconductor layer on the light extraction plane of the semiconductor layer in the direction perpendicular to the light extraction plane. Alternatively, in addition to the formation of the first electrode on a region other than the region obtained by projecting the end face of the semiconductor layer on the light extraction plane of the semiconductor layer in the direction perpendicular to the light extraction plane, small recesses and projections that enhance the extraction efficiency of light with the emission wavelength are formed regularly or irregularly on the light extraction plane other than the region on which the first electrode is formed, or a photonic crystal formed of regular recesses and projections that can enhance the light extraction efficiency in particular is formed thereon. Alternatively, the first electrode is formed to cover the end face of the semiconductor layer. Further alternatively, when the end face of the semiconductor layer is the light extraction plane, the first electrode is formed over the whole of the plane on which the first electrode is to be provided, and a material having as high a reflectivity as possible for light with the emission wavelength is used as the material of the first and second electrodes.

The above descriptions related to the first embodiment also apply to the third embodiment as long as they do not contradict the nature of the third embodiment.

The above-described light emitting diodes can be used for a light emitting diode backlight, a light emitting diode illuminating device, a light emitting diode display, and an electronic apparatus to be described later.

According to a fourth embodiment, there is provided a light emitting diode backlight including a plurality of arranged light emitting diodes for emitting red light, a plurality of arranged light emitting diodes for emitting green light, and a plurality of arranged light emitting diodes for emitting blue light. At least one light emitting diode of these light emitting diodes includes a semiconductor layer that forms a light emitting diode structure and has a major face and an end face inclined at an angle $\theta_1$ to the major face, and a reflector that is provided outside the end face with being opposed to the end face, and includes at least a portion inclined at an angle $\theta_2$ smaller than the angle $\theta_1$ to the major face.

According to a fifth embodiment, there is provided a light emitting diode illuminating device including a plurality of arranged light emitting diodes for emitting red light, a plurality of arranged light emitting diodes for emitting green light, and a plurality of arranged light emitting diodes for emitting blue light. At least one light emitting diode of these light emitting diodes includes a semiconductor layer that forms a light emitting diode structure and has a major face and an end face inclined at an angle $\theta_1$ to the major face, and a reflector that is provided outside the end face with being opposed to the end face, and includes at least a portion inclined at an angle $\theta_2$ smaller than the angle $\theta_1$ to the major face.

According to a sixth embodiment, there is provided a light emitting diode display including a plurality of arranged light emitting diodes for emitting red light, a plurality of arranged light emitting diodes for emitting green light, and a plurality of arranged light emitting diodes for emitting blue light. At least one light emitting diode of these light emitting diodes includes a semiconductor layer that forms a light emitting diode structure and has a major face and an end face inclined at an angle $\theta_1$ to the major face, and a reflector that is provided outside the end face with being opposed to the end face, and includes at least a portion inclined at an angle $\theta_2$ smaller than the angle $\theta_1$ to the major face.

In the fourth to sixth embodiments, light emitting diodes employing e.g. a nitride-based III-V group compound semiconductor can be used as the light emitting diodes for emitting red light, the light emitting diodes for emitting green light and the light emitting diodes for emitting blue light. As the light emitting diodes for emitting red light, light emitting diodes employing e.g. an AlGaIrP-based semiconductor can also be used.

According to a seventh embodiment, there is provided an electronic apparatus including at least one light emitting diode. The light emitting diode includes a semiconductor layer that forms a light emitting diode structure and has a major face and an end face inclined at an angle $\eta_1$ to the major face, and a reflector that is provided outside the end face with being opposed to the end face, and includes at least a portion inclined at an angle $\theta_2$ smaller than the angle $\theta_1$ to the major face.

Any apparatus is available as this electronic apparatus basically as long as it includes at least one light emitting diode for use for a backlight of a liquid crystal display, a display unit, an illuminating unit, etc. The electronic apparatus encompasses both portable and stationary apparatuses, and specific examples thereof include cellular phones, mobile apparatuses, robots, personal computers, vehicle apparatuses and various home electric appliances.

The above descriptions related to the first embodiment also apply to the fourth to seventh embodiments as long as they do not contradict the nature of the fourth to seventh embodiments.

In the first, second, and fourth to seventh embodiments with the above-described configuration, light that is generated inside the semiconductor layer (active layer) in the operation of the light emitting diode is emitted from the end face inclined to the major face of the semiconductor layer, followed by being reflected toward the light extraction plane by the reflector provided outside the end face. This results in an increased ratio of light that can be extracted to the external.

In the third embodiment, light that is generated inside the semiconductor layer (active layer) in the operation of the light emitting diode is not blocked by the opaque first electrode but can be extracted to the external.

According to the embodiments of the invention, a light emitting diode can be achieved that allows a great improvement of the light extraction efficiency to thereby significantly enhance the emission efficiency, and can easily achieve a miniaturized size. In addition, using the light emitting diode with high emission efficiency and a miniaturized size allows achievement of high-performance light emitting diode backlight, light emitting diode illuminating device, light emitting diode display, and various electronic apparatuses.

Additional features and advantages are described herein, and will be apparent from, the following Detailed Description and the figures.

DETAILED DESCRIPTION

Embodiments of the present invention will be described below with reference to the accompanying drawings. In all the drawings for the embodiments, the same and equivalent parts are given the same numerals.

A first embodiment will be described below.

Figure 1:
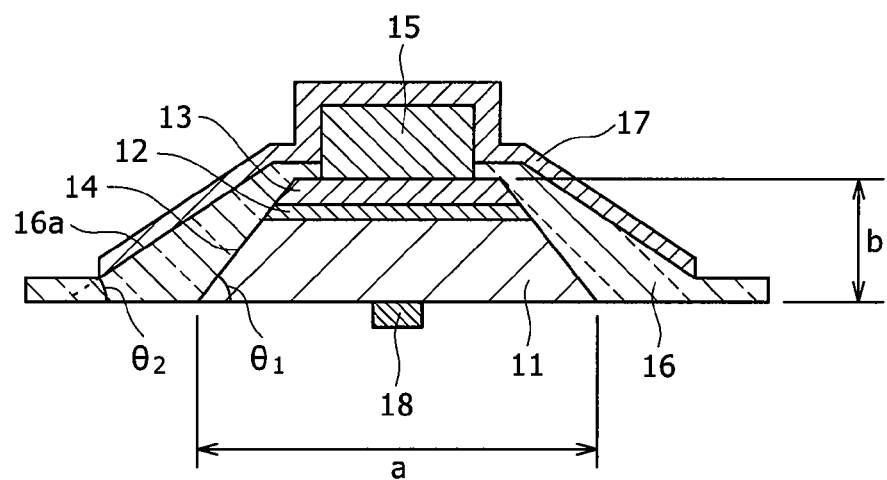
FIG. 1 is a sectional view illustrating a GaN-based light emitting diode according to a first embodiment of the invention.

FIG. 1 illustrates a GaN-based light emitting diode according to the first embodiment.

Referring to FIG. 1, in this GaN-based light emitting diode, an n-GaN layer 11, an active layer 12 thereon, and a p-GaN layer 13 thereon construct a light emitting diode structure. The n-GaN layer 11, the active layer 12 and the p-GaN layer 13 have e.g. a circular planar shape as a whole, and have an end face (side face) 14 that is inclined at an angle $\theta_1$ to the lower face of the n-GaN layer 11. A section of the n-GaN layer 11, the active layer 12 and the p-GaN layer 13 perpendicular to a diameter direction thereof has either one of a trapezoidal shape ($\theta_1$<90 degrees), a rectangular shape ($\theta_1$=90 degrees) and an inverted trapezoidal shape ($\theta_1$>90 degrees). Formed on the p-GaN layer 13 is a p-electrode 15 with e.g. a circular shape. A transparent resin 16 is formed to cover the end face 14 and the upper face of the p-GaN layer 13 in the periphery of the p-electrode 15. A reflective film 17 is formed to cover the transparent resin 16 and the entire p-electrode 15. An n-electrode 18 having e.g. a circular shape is formed on the lower face of the n-GaN layer 11.

The structure of this GaN-based light emitting diode is optimized as follows to achieve the maximized light extraction efficiency.

(1) An inclined face 16a of the transparent resin 16 is inclined at an angle $\theta_2$ to the lower face of the n-GaN layer 11, and hence the reflective film 17 is also inclined at the angle $\theta_2$ to the lower face of the n-GaN layer 11. The angle $\theta_2$ is smaller than the angle $\theta_1$. Thus, light that is emanated from the active layer 12 and leaves from the end face 14 is reflected by the reflective film 17 downward, and thus is readily extracted to the external.

(2) The refractive index $n_2$ of the transparent resin 16 satisfies the following relationship: the refractive index of air<$n_2$<$n_1$, where $n_1$ is the total average refractive index n, of the n-GaN layer 11, the active layer 12 and the p-GaN layer 13. Thus, compared with the case in which the medium outside the end face 14 is air, light emanated from the active layer 12 and incident on the end face 14 more readily leaves from the end face 14 to the external, and therefore is more readily extracted to the outside finally.

(3) When the maximum diameter of the light emitting diode structure, i.e., the diameter of the lower face of the n-GaN layer 11 is defined as a, and the thickness (height) of the entire structure is defined as b, the aspect ratio b/a is in the range from 0.01 to 2 and the thickness b is in the range from 0.3 μm to 10 μm.

(4) For the reflective film 17, a material having as high a reflectivity as possible for light with the emission wavelength, such as Ag or a metal composed mainly of Ag, is used. Thus, light emitted from the end face 14 and the upper face of the p-GaN layer 13 to the external can be reflected by the reflective film 17 efficiently, and therefore is readily extracted to the outside finally. The reflective film 17 forms an ohmic contact with the p-electrode 15, and serves also as part of the p-electrode 15 or part of an interconnect connected to the p-electrode 15. This feature can reduce the resistance of the p-electrode 15, and thus can decrease the operating voltage.

Figure 2:
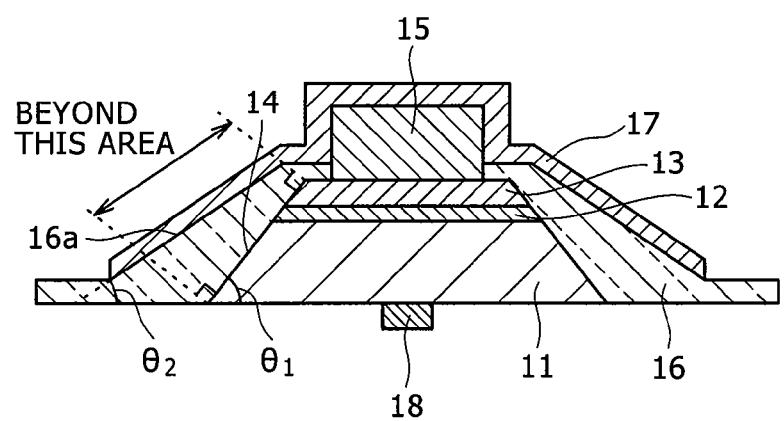
FIG. 2 is a sectional view for explaining the GaN-based light emitting diode according to the first embodiment.

(5) Referring to FIG. 2, when the angle $\theta_1$ is in the range of $30° \leq \theta_1 \leq 90°$, the reflective film 17 covers at least the region obtained by projecting the end face 14 on the inclined face 16a of the transparent resin 16 in the direction perpendicular to the end face 14. In addition, for $90° < \theta_1 \leq 150°$, the reflective film 17 covers at least the region obtained by projecting the end face 14 on the inclined face 16a of the transparent resin 16 in the direction arising from mirror reflection of the direction perpendicular to the end face 14 about the light extraction plane, i.e., the lower face of the n-GaN layer 11 as the mirror plane. Thus, most of light that is emanated from the active layer 12 and leaves from the end face 14 is reflected by the reflective film 17 downward, and thus is readily extracted to the external.

(6) The reflective film 17 is formed not only on the transparent resin 16 provided on the end face 14 but also on the p-electrode 15 and on the transparent resin 16 provided on the p-GaN layer 13. Thus, not only light that is emanated from the active layer 12 and leaves from the end face 14 but also light emitted from the upper face of the p-GaN layer 13 is reflected by the reflective film 17 downward, and thus is readily extracted to the external.

Figure 3:
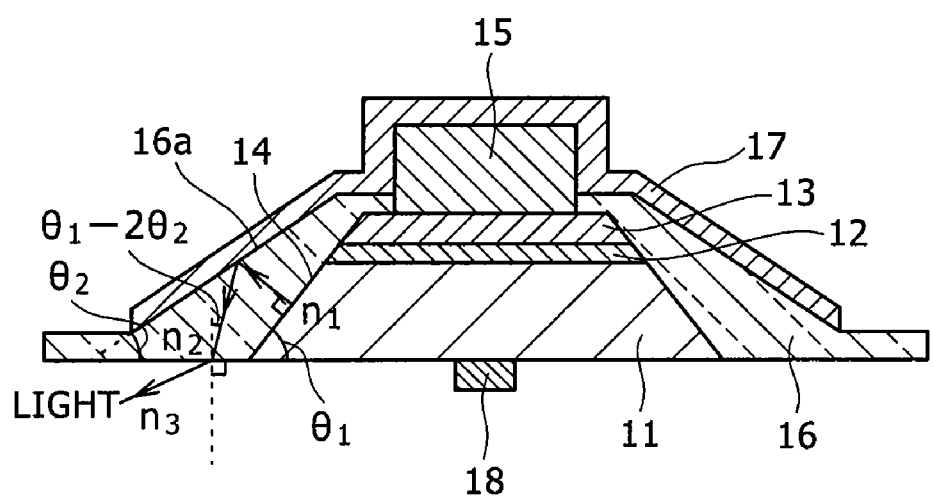
FIG. 3 is a sectional view for explaining the GaN-based light emitting diode according to the first embodiment.

(7) The angles $\theta_1$ and $\theta_2$ are chosen so that the following inequalities are satisfied: when the angle $\theta_1$ is in the range of $30° \leq \theta_1 \leq 90°$, $\theta_2 \geq (\theta_1 - \sin^{-1}(n_3/n_2))/2$ and $\theta_2 \leq \theta_1/2$; and when $90° < \theta_1 \leq 150°$, $\theta_2 \geq ((\theta_1 - 90) - \sin^{-1}(n_3/n_2))/2$ and $\theta_2 \leq (\theta_1 - 90)/2$. In the inequalities, $n_3$ is the refractive index of the external medium in contact with the lower face of the transparent resin 16. When the angle $\theta_1$ is smaller than 90 degrees, light totally reflected by the light extraction plane reaches the reflective film 17. As shown in FIG. 3, the above-described relationships $\theta_2 \geq (\theta_1 - \sin^{-1}(n_3/n_2))/2$ and $\theta_2 \geq ((\theta_1 - 90) - \sin^{-1}(n_3/n_2))/2$ correspond to the condition that prevents light emitted from the end face 14 in the direction perpendicular to the end face 14 from being totally reflected by the interface between the transparent resin 16 and the external medium thereof. In addition, the relationships $\theta_2 \leq \theta_1/2$ and $\theta_2 \leq (\theta_1 - 90)/2$ correspond to the condition that prevents light from passing through the end face 14 from the transparent resin 16.

(8) The n-electrode 18 is formed on the region obtained by projecting the upper face of the p-GaN layer 13 on the lower face of the n-GaN layer 11 in the direction perpendicular to the upper face of the p-GaN layer 13. This feature offers the following advantage. Specifically, in this GaN-based light emitting diode, most of light that is emanated from the active layer 12 and is reflected by the end face 14 downward so as to be extracted to the external is concentrated in the region obtained by projecting the end face 14 on the lower face of the n-GaN layer 11. If the n-electrode 18 is not formed in this region, light to be extracted to the external is not blocked by the n-electrode 18, which avoids loss of the light amount. Therefore, it is preferable for the n-electrode 18 to be formed in a region other than this region, in other words, in the region obtained by projecting the upper face of the p-GaN layer 13 on the lower face of the n-GaN layer 11 in the direction perpendicular to the upper face of the p-GaN layer 13. The n-electrode 18 may be formed to cover part of this region, or alternatively may be formed to cover the whole of this region as long as it exists within this region.

One specific example of the sizes, materials and other conditions of the respective components in the GaN-based light emitting diode is as follows. The thicknesses of the n-GaN layer 11, the active layer 12 and the p-GaN layer 13 are 2600 nm, 200 nm and 200 nm, respectively. The active layer 12 has a multiple quantum well (MQW) structure formed of an InGaN well layer and a GaN barrier layer. The In composition in the InGaN well layer is 0.17 when the GaN-based light emitting diode emits blue light, and is 0.25 when it emits green light. The maximum diameter a of the light emitting diode structure is 20 µm. When the thicknesses of the n-GaN layer 11, the active layer 12 and the p-GaN layer 13 are 2600 nm, 200 nm and 200 nm, respectively as described above, the thickness of the entire light emitting diode structure is 2600+200+200=3000 nm=3 µm. Accordingly, the aspect ratio of the light emitting diode structure is b/a=3/20=0.15. The angle $\theta_1$ is 50 degrees. When the refractive index $n_2$ of the transparent resin 16 is 1.6, and if the transparent resin 16 is applied by spin coating so that the thickness thereof immediately after the application is 1 µm in its flat part and the thickness is decreased to 70% due to cure shrinkage, the angle $\theta_2$ is 20 degrees. The p-electrode 15 is formed of a metal multilayer film with an Ag/Pt/Au structure. The thicknesses of the Ag, Pt and Au films are 50 nm, 50 nm and 2000 nm, respectively. The p-electrode 15 may be formed of an Ag monolayer film. The reflective film 17 is formed of a metal multilayer film with an Ag/Au structure. The thicknesses of both the Ag and Au films are 50 nm. The reflective film 17 may be formed of an Ag monolayer film. The n-electrode 18 is formed of a metal multilayer film with a Ti/Pt/Au structure. The thicknesses of the Ti, Pt and Au films are 50 nm, 50 nm and 2000 nm, respectively.

In this GaN-based light emitting diode, one part of light emanated from the active layer 12 in the operation of the diode is reflected by the end face 14 and is extracted from the lower face of the n-GaN layer 11 to the external. Another part of the light from the active layer 12 is emitted from the end face 14 and the upper face of the p-GaN layer 13 and is reflected by the reflective film 17, followed by being extracted from the lower face of the transparent resin 16 to the external. Furthermore, the rest part of the light from the active layer 12 directly reaches the lower face of the n-GaN layer 11 so as to be extracted to the outside. Since the respective components in this diode are optimized in terms of maximization of the light extraction efficiency as described above, the amount of light extracted from this GaN-based light emitting diode to the external is extremely large.

One example of a method of manufacturing the GaN-based light emitting diode will be described below.

Figure 4A:
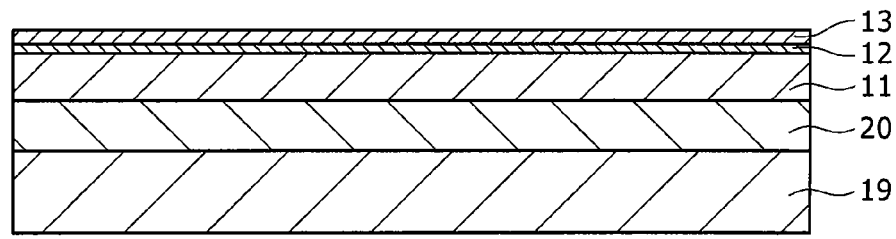
FIGS. 4A to 4F are sectional views for explaining a method of manufacturing the GaN-based light emitting diode according to the first embodiment.

Referring initially to FIG. 4A, a sapphire substrate 19 of which major face is the C+ plane and thickness is 430 µm is prepared, and the surface thereof is cleaned by thermal cleaning or the like. Subsequently, on the sapphire substrate 19, a GaN buffer layer 20 with a thickness of 1000 nm is deposited by metalorganic chemical vapor deposition (MOCVD) at a low temperature of about 500° C., and then the temperature is increased to about 1000° C. to crystallize the deposited layer. Subsequently, on the GaN buffer layer 20, the n-GaN layer 11 doped with Si as an n-type impurity, the active layer 12 and the p-GaN layer 13 doped with Mg as a p-type impurity are sequentially grown. The n-GaN layer 11 is grown at a temperature of about 1000° C., the active layer 12 at about 750° C,. and the p-GaN layer 13 at about 900° C. The n-GaN layer 11 is grown in a hydrogen gas atmosphere, the active layer 12 in a nitrogen gas atmosphere, and the p-GaN layer 13 in a hydrogen gas atmosphere.

Examples of growth materials for the GaN-based semiconductor layers include trimethylgallium $((CH_3)_3Ga$, TMG) as a material for Ga, trimethylaluminum $((CH_3)_3Al$, TMA) as a material for Al, trimethylindium $((CH_3)_3In$, TMI) as a material for In, and ammonia $(NH_3)$ as a material for N. As for dopants, silane $(SiH_4)$ is used as the n-type dopant, and bis(methylcyclopentadienyl)magnesium $((CH_3C_5H_4)_2Mg)$ or bis(cyclopentadienyl)magnesium $(C_5H_5)_2Mg)$ is used as the p-type dopant.

Subsequently, the sapphire substrate 19 over which the GaN-based semiconductor layers have been grown as described above is brought out from the MOCVD apparatus.

Figure 4B:
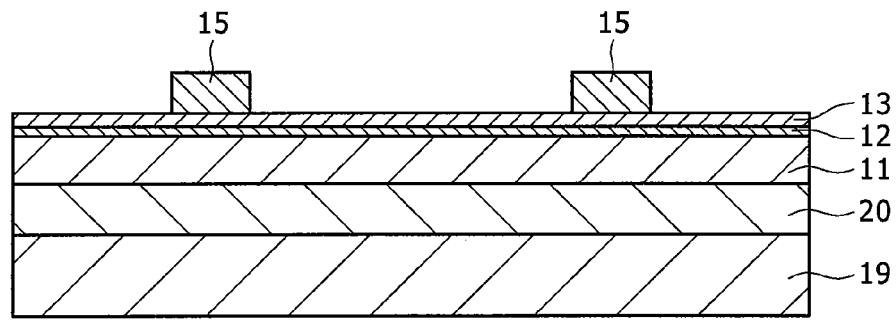

Next, a resist pattern with predetermined circular shapes is formed on the substrate surface by photolithography, and Ag, Pt and Au films are sequentially formed on the entire substrate surface by sputtering, followed by removal (lift-off) of the resist pattern together with the Ag, Pt and Au films thereon. Thus, as shown in FIG. 4B, the circular p-electrodes 15 of an Ag/Pt/Au structure are formed on the p-GaN layer 13.

Figure 4C:
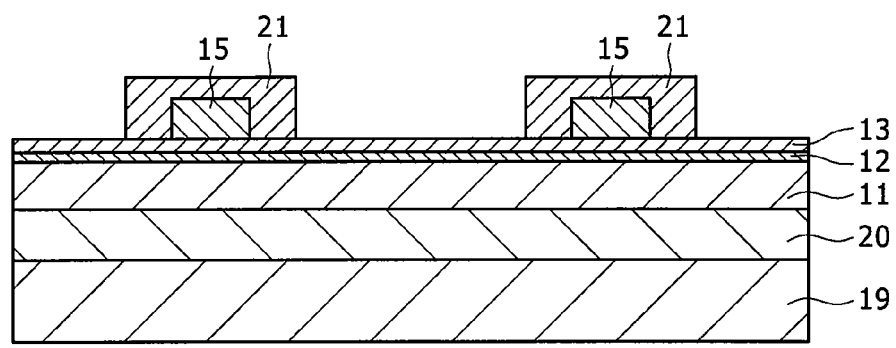

Subsequently, as shown in FIG. 4C, circular resist patterns 21 are formed to cover the p-electrodes 15 and the surfaces of predetermined regions on the p-GaN layer 13.

Figure 4D:
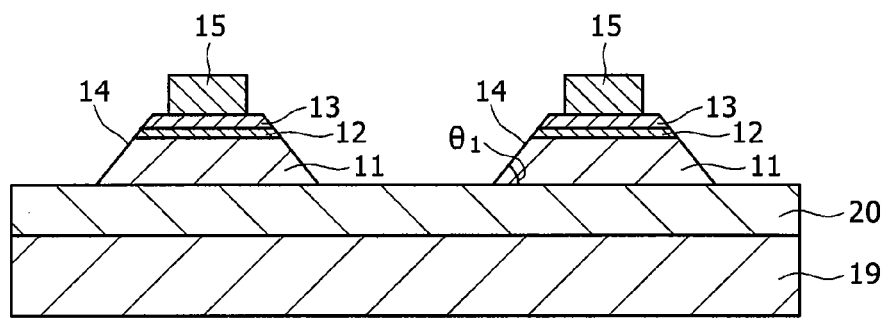

Next, by reactive ion etching (RIE) employing a chlorine gas as the etching gas and the resist patterns 21 as the etching mask, etching is carried out under a condition that offers taper etching until exposure of part of the GaN buffer layer 20, followed by removal of the resist patterns 21. In this manner, the end faces 14 with the inclination angle $\theta_1$ are formed as shown in FIG. 4D.

Figure 4E:
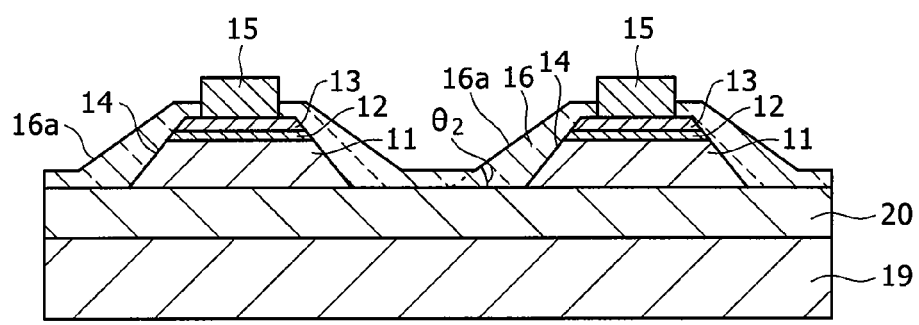

Referring next to FIG. 4E, the transparent resin 16 is formed. Examples of the forming method of the transparent resin 16 include the following methods. In a first method, the transparent resin 16 is applied over the entire surface by spin coating so that the inclination angle of the inclined faces 16a is automatically set to the angle $\theta_2$. In a second method, the transparent resin 16 is applied by spin coating or the like, and then the transparent resin 16 is subjected to cure shrinkage to thereby set the inclination angle of the inclined faces 16a to the angle $\theta_2$. In a third method, the transparent resin 16 is formed by photolithography. Specifically, resist (photosensitive resin) is used as the transparent resin 16, and the inclination angle of the inclined faces 16a is set to the angle $\theta_2$ through the application, exposure and development of this resist. In a fourth method, the transparent resin 16 is press-formed by use of a predetermined mold so that the inclination angle of the inclined faces 16a is set to the angle $\theta_2$. In a fifth method, the transparent resin 16 is formed by thermal imprinting so that the inclination angle of the inclined faces 16a is set to the angle $\theta_2$. In a sixth method, the transparent resin 16 is formed by UV imprinting so that the inclination angle of the inclined faces 16a is set to the angle $\theta_2$. In a seventh method, the transparent resin 16 is applied by spin coating or the like, and then the transparent resin 16 is cured with being pressed against an elastically deformable release layer so that the inclination angle of the inclined faces 16a is set to the angle $\theta_2$.

Figure 4F:
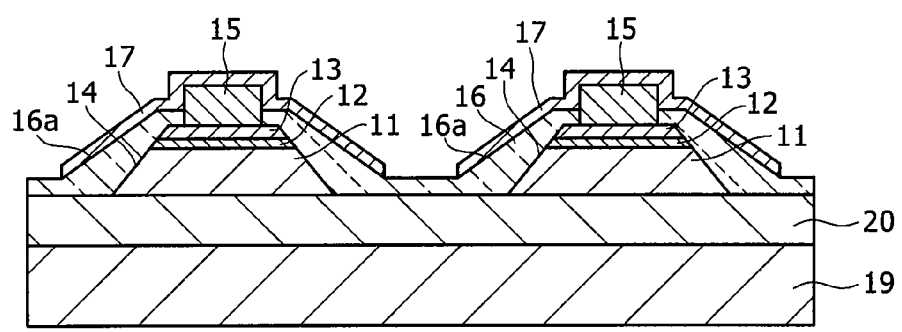

Next, Ag and Au films are sequentially formed over the entire substrate surface by sputtering, and then a resist pattern with predetermined circular shapes is formed over the Ag and Au films by photolithography, followed by etching of the Ag and Au films with use of the resist pattern as the mask. Thus, as shown in FIG. 4F, the circular reflective films 17 with an Ag/Au structure are formed on the transparent resin 16 and the p-electrodes 15.

Subsequently, another sapphire substrate (not shown) that is separately prepared is applied to the reflective films 17 with use of resin or the like. Thereafter, the sapphire substrate 19 is irradiated with a laser beam such as an excimer laser beam from the back face thereof to cause ablation in the boundary between the sapphire substrate 19 and the n-GaN layer 11, to thereby separate the portion from the n-GaN layer 11 up from the sapphire substrate 19. Next, by chemical mechanical polishing (CMP), the GaN buffer layer 20 on the separation surface is removed, and the n-GaN layers 11 are thinned until the polished plane reaches the inclined faces 16a. At this time, the respective GaN-based light emitting diodes are isolated from each other.

Subsequently, resist patterns with predetermined circular shapes are formed on the surfaces of the n-GaN layers 11 by photolithography, and Ti, Pt and Au films are sequentially formed on the entire surfaces by sputtering, followed by removal (lift-off) of the resist patterns together with the Ti, Pt and Au films thereon. Thus, the circular n-electrodes 18 with a Ti/Pt/Au structure are formed on the n-GaN layers 11.

Thereafter, the sapphire substrate applied to the reflective films 17 is removed so that the respective GaN-based light emitting diodes are separated from each other.

Through the above-described steps, the intended GaN-based light emitting diode shown in FIG. 1 is completed. The thus manufactured GaN-based light emitting diode may be used alone as a single element, or alternatively may be applied to another substrate according to application. In addition, it may be transferred and may be coupled to interconnects.

Figure 5:
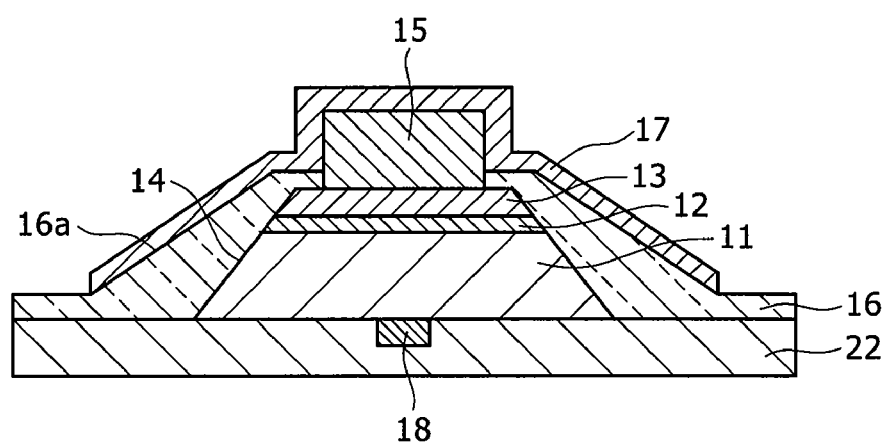
FIG. 5 is a sectional view illustrating the GaN-based light emitting diode according to the first embodiment further including a transparent interconnect formed on an n-electrode.

FIG. 5 shows an example in which, in addition to the n-electrode 18, a transparent interconnect 22 that is composed of e.g. ITO and covers the n-electrode 18 is formed on the back face of the n-GaN layer 11.

Figure 6:
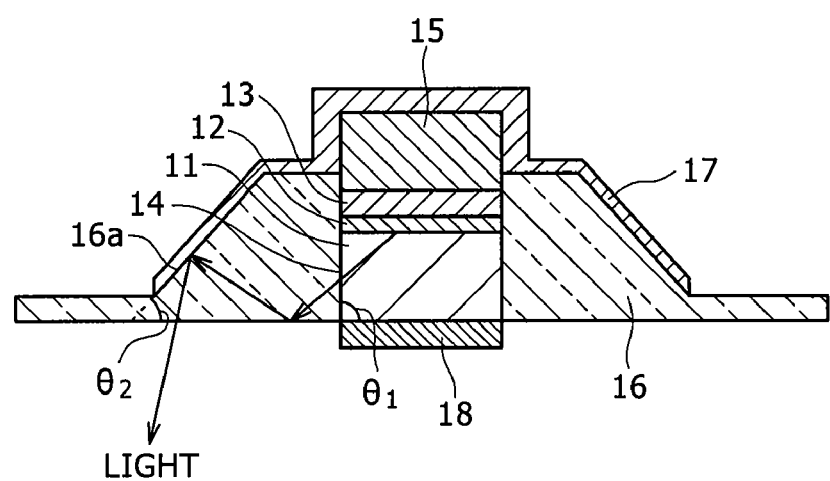
FIG. 6 is a sectional view illustrating the GaN-based light emitting diode according to the first embodiment when an angle $\theta_1$ is 90 degrees.
Figure 20:
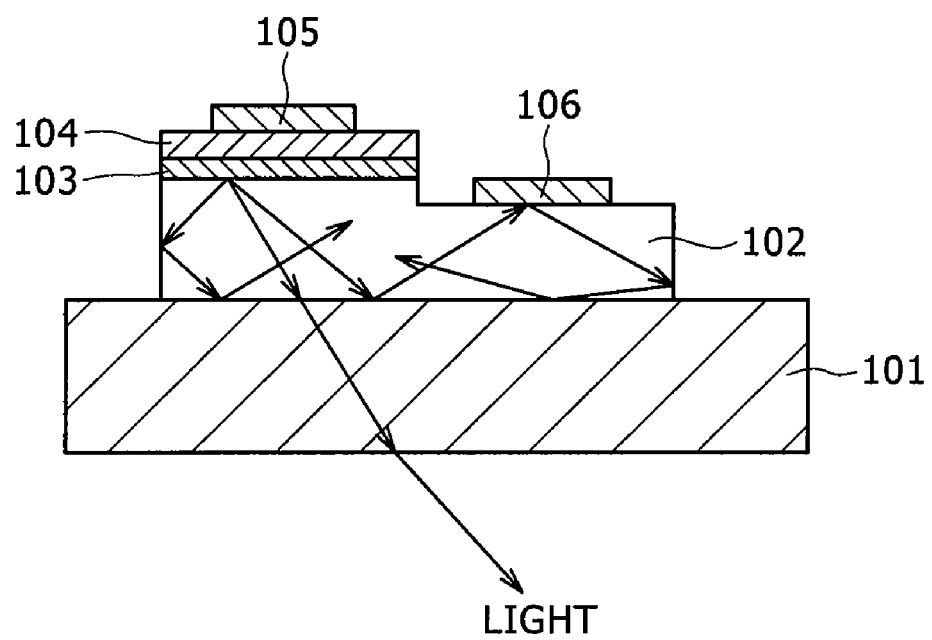
FIG. 20 is a sectional view illustrating a conventional GaN-based light emitting diode.

FIG. 6 illustrates a GaN-based light emitting diode in which a section of the n-GaN layer 11, the active layer 12 and the p-GaN layer 13 perpendicular to a diameter direction thereof has a rectangular shape ($\theta_1=90$ degrees). In this diode, the p-electrode 15 is formed on the whole of the upper face of the p-GaN layer 13, and the n-electrode 18 is formed on the entire back face of the n-GaN layer 11. The diameter of the n-GaN layer 11, the active layer 12 and the p-GaN layer 13 is e.g. 10 µm or less, and typically at most 5 µm. In addition, it is normally larger than 2 to 3 µm since a too small diameter leads to difficulty in obtaining sufficient emission intensity. However, the diameter is not limited thereto. In this GaN-based light emitting diode, although the diameter of the n-GaN layer 11, the active layer 12 and the p-GaN layer 13 has such a small value, the formation of the p- and n-electrodes 15 and 18 on the whole of faces of the p- and n-GaN layers 13 and 11, respectively, offers advantages. Specifically, a reduced current density can be achieved and thus luminance saturation can be prevented. Furthermore, the contact resistance of the p-electrode 15 and the n-electrode 18 can be decreased, which can reduce the operating voltage. In addition, unlike a conventional GaN-based light emitting diode shown in FIG. 20, light emanated from the active layer 12 is not absorbed through repetition of total reflection inside the n-GaN layer 11, the active layer 12 and the p-GaN layer 13 but can be extracted to the outside. One example of a light path of light that is emanated from the active layer 12 and is extracted to the external finally is indicated in FIG. 6.

Figure 7:
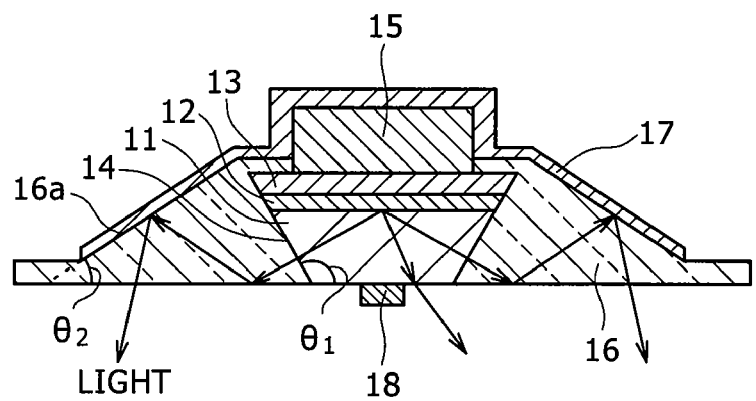
FIG. 7 is a sectional view illustrating the GaN-based light emitting diode according to the first embodiment when the angle $\theta_1$ is larger than 90 degrees.

FIG. 7 illustrates a GaN-based light emitting diode in which a section of the n-GaN layer 11, the active layer 12 and the p-GaN layer 13 perpendicular to a diameter direction thereof has an inverted trapezoidal shape ($\theta_1>90$ degrees). In this structure, the diameter of the p-GaN layer 13 can be increased and therefore the diameter of the p-electrode 15 can be increased compared with the structure in which a section of the n-GaN layer 11, the active layer 12 and the p-GaN layer 13 perpendicular to a diameter direction thereof has a trapezoidal shape ($\theta_1<90$ degrees). Therefore, a reduced current density can be achieved and thus luminance saturation can be prevented. Moreover, the contact resistance of the p-electrode 15 can be decreased, which can reduce the operating voltage. One example of a light path of light that is emanated from the active layer 12 and is extracted to the external finally is indicated in FIG. 7.

Figure 8:
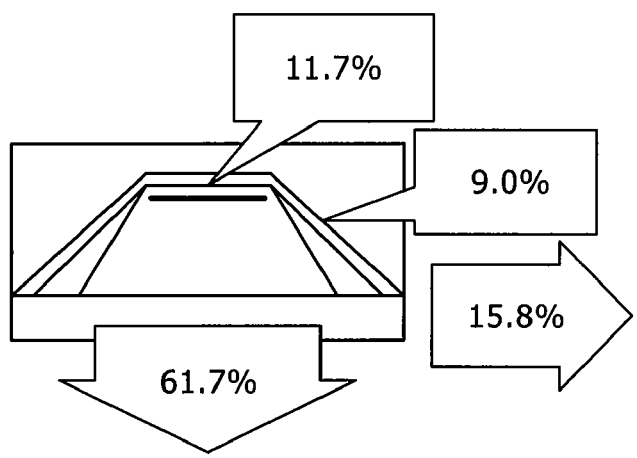
FIG. 8 is a schematic diagram for explaining light extraction from the GaN-based light emitting diode according to the first embodiment.
Figure 21:
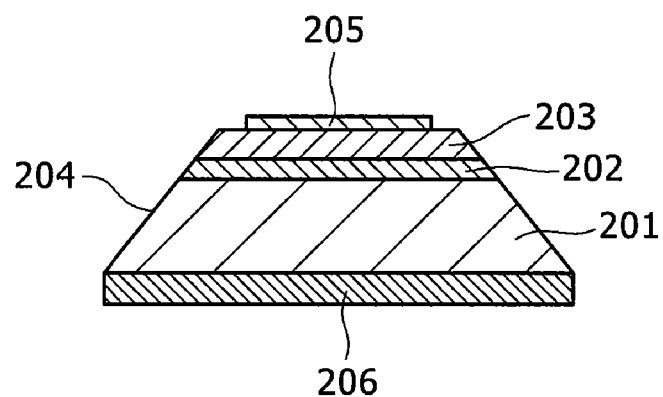
FIG. 21 is a sectional view illustrating a GaN-based light emitting.
Figure 22:
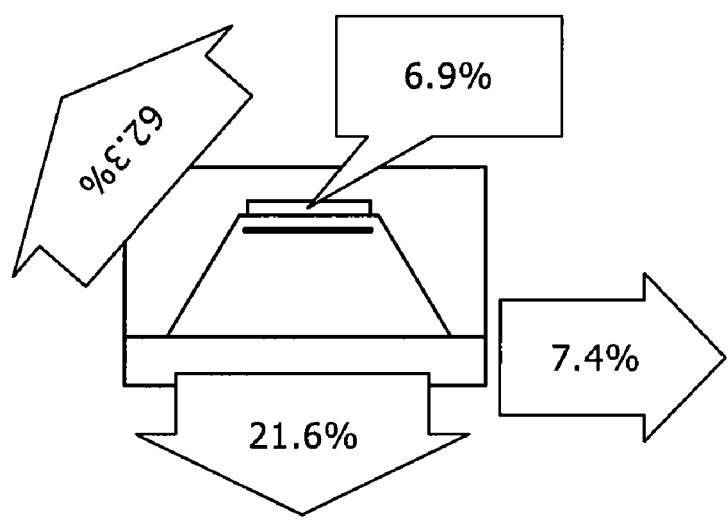
FIG. 22 is a schematic diagram for explaining light extraction from the GaN-based light emitting diode.

As described above, the first embodiment can achieve the maximized light extraction efficiency through optimization of the structure of a GaN-based light emitting diode, and thus can achieve significantly enhanced emission efficiency. For example, as shown in FIG. 8, the GaN-based light emitting diode of the first embodiment allows about 61.7% of light emanated from the active layer 12 to be extracted from the lower face of the n-GaN layer 11. This light extraction efficiency is significantly higher than that of the GaN-based light emitting diode in FIG. 21, which is at most about 20%. Furthermore, the GaN-based light emitting diode of the first embodiment has a structure suitable for its size reduction. Therefore, an ultra small diode with a size of e.g. several tens of micrometers or less can be achieved easily.

Figure 9:
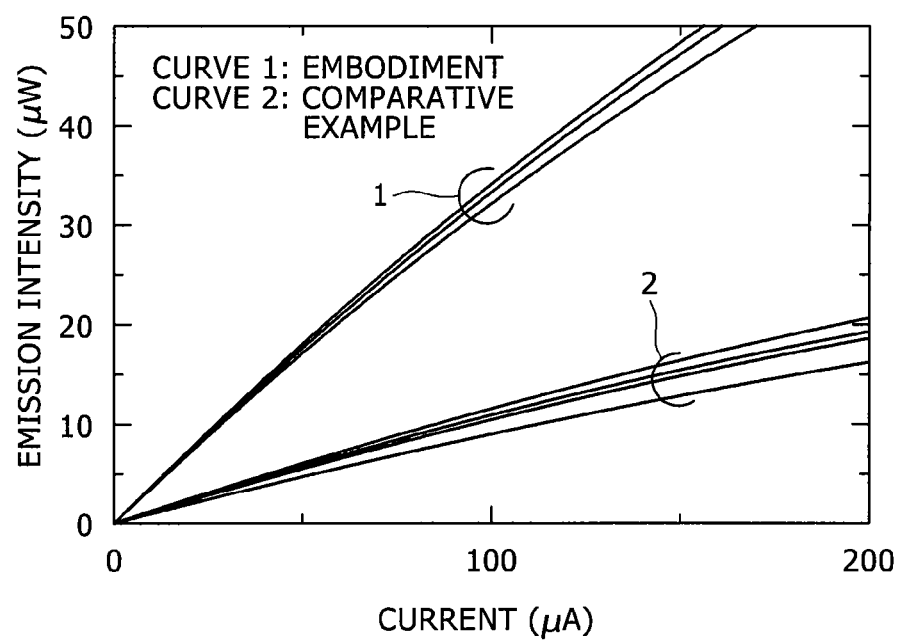
FIG. 9 is a schematic diagram showing an example of a measurement result on the emission intensity vs. current characteristic of the GaN-based light emitting diode according to the first embodiment.

FIG. 9 shows a measurement result on the emission intensity vs. current characteristic of a GaN-based light emitting diode according to the first embodiment. In this diode, an Ag monolayer film is used as the p-electrode 15 and the reflective film 17. The maximum diameter a of the light emitting diode structure is 20 µm. The thicknesses of the n-GaN layer 11, the active layer 12 and the p-GaN layer 13 are 2600 nm, 200 nm and 200 nm, respectively. The angles $\theta_1$ and $\theta_2$ are 50 and 20 degrees, respectively. For comparison, FIG. 9 also shows a measurement result on the emission intensity vs. current characteristic of a GaN-based light emitting diode of which structure is the same as that of the GaN-based light emitting diode of the embodiment, except that a Ni monolayer film is used as the p-electrode 15, and the reflective film 17 is not formed. As is apparent from FIG. 9, the emission intensity of the GaN-based light emitting diode of the first embodiment, which includes the reflective film 17, is about three times as high as that of the GaN-based light emitting diode as a comparative example, which employs a Ni monolayer film as the p-electrode 15 and includes no reflective film 17.

As this GaN-based light emitting diode, blue-light-emitting, green-light-emitting and red-light-emitting diodes can be achieved. This GaN-based light emitting diode allows light emitting diode displays, light emitting diode backlights, light emitting diode illuminating devices and other devices to be realized easily. Furthermore, this GaN-based light emitting diode can also be used for a display unit and an illumination unit in various electronic apparatuses such as cellular phones. This GaN-based light emitting diode may be used as blue-light-emitting and green-light-emitting diodes, while an AlGaInP-based light emitting diode to be described later for emitting red light may be used as a red-light-emitting diode.

A second embodiment will be described below.

Figure 10:
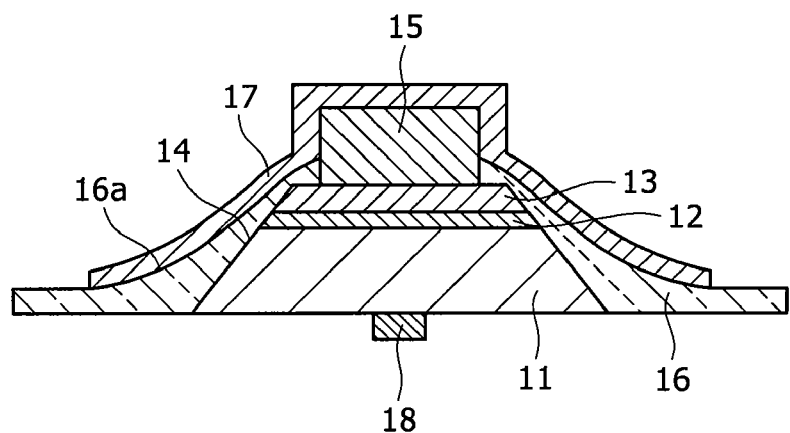
FIG. 10 is a sectional view illustrating a GaN-based light emitting diode according to a second embodiment.

FIG. 10 illustrates a GaN-based light emitting diode according to the second embodiment.

As shown in FIG. 10, this GaN-based light emitting diode has the same structure as that of the GaN-based light emitting diode of the first embodiment, except that an inclined face 16a of a transparent resin 16 is not a flat plane but a concave plane in which intermediate part bends downward, and a reflective film 17 is formed on this concave inclined face 16a.

The second embodiment offers the same advantages as those of the first embodiment.

A third embodiment of the invention will be described below.

Figure 11:
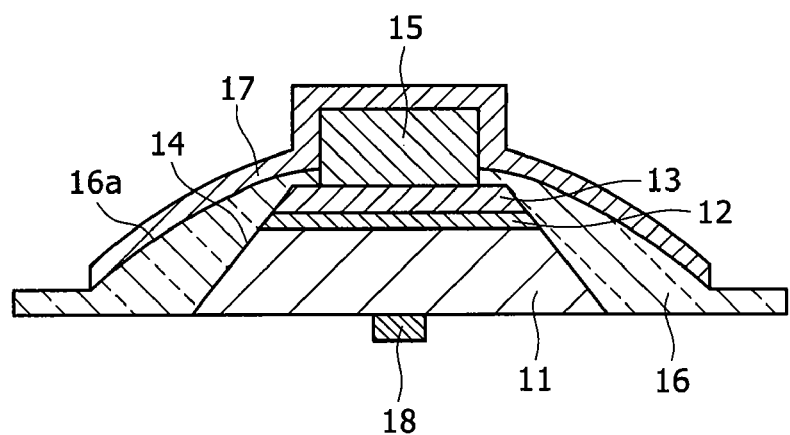
FIG. 11 is a sectional view illustrating a GaN-based light emitting diode according to a third embodiment.

FIG. 11 illustrates a GaN-based light emitting diode according to the third embodiment.

As shown in FIG. 11, this GaN-based light emitting diode has the same structure as that of the GaN-based light emitting diode of the first embodiment, except that an inclined face 16a of a transparent resin 16 is not a flat plane but a convex plane in which intermediate part is protruding, and a reflective film 17 is formed on this convex inclined face 16a.

The third embodiment also offers the same advantages as those of the first embodiment.

A fourth embodiment will be described below.

Figure 12:
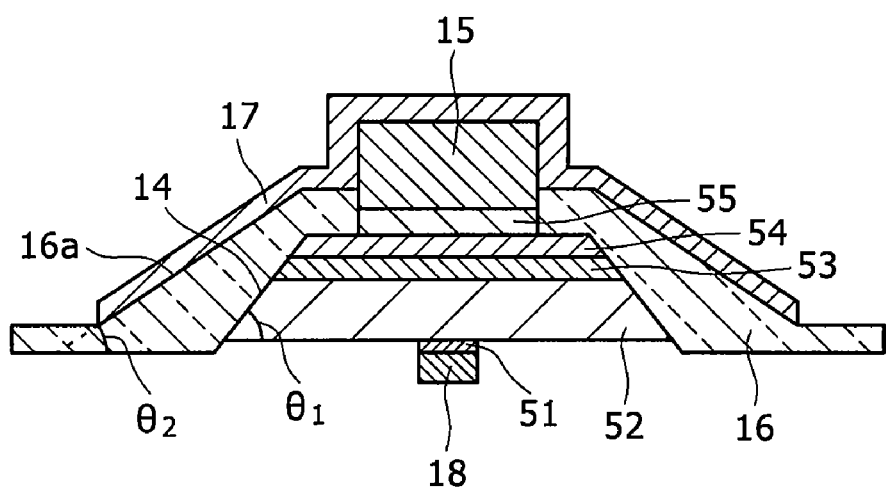
FIG. 12 is a sectional view illustrating an AlGaInP-based light emitting diode according to a fourth embodiment of the invention.

FIG. 12 illustrates an AlGaInP-based light emitting diode according to the fourth embodiment.

Referring to FIG. 12, in this AlGaInP-based light emitting diode, an n-GaAs layer 51, an n-AlGaInP layer 52 thereon, an active layer 53, a p-AlGaInP layer 54, and a p-GaAs layer 55 thereon construct a light emitting diode structure. The n-GaAs layer 51 is formed only on the center part of the n-AlGaInP layer 52. The p-GaAs layer 55 is formed only on the center part of the p-AlGaInP layer 54. The n-AlGaInP layer 52, the active layer 53 and the p-AlGaInP layer 54 have e.g. a circular planar shape as a whole, and a section thereof perpendicular to a diameter direction thereof has either one of a trapezoidal shape, a rectangular shape and an inverted trapezoidal shape. An end face 14 is inclined at an angle $\theta_1$ to the major face of these layers. A p-electrode 15 having e.g. a circular shape is formed on the p-GaAs layer 55. A transparent resin 16 is formed to cover the end face 14 of this light emitting diode structure and the upper face of the p-AlGaInP layer 54 in the periphery of the p-GaAs layer 55. A reflective film 17 is formed to cover the transparent resin 16 and the entire p-electrode 15. An n-electrode 18 having e.g. a circular shape is formed on the lower face of the n-GaAs layer 51.

This AlGaInP-based light emitting diode has the same features as the above-described features (1) to (8) of the GaN-based light emitting diode according to the first embodiment.

One specific example of the sizes, materials and other conditions of the respective components in the AlGaInP-based light emitting diode is as follows. The thicknesses of the n-GaAs layer 51 and the n-AlGaInP layer 52 are 50 nm and 1000 nm, respectively. The thicknesses of the active layer 53, the p-AlGaInP layer 54 and the p-GaAs layer 55 are 900 nm, 1000 nm and 50 nm, respectively. The compositions of the n-AlGaInP layer 52 and the p-AlGaInP layer 54 are such that if the sum of the Al composition and the Ga composition is almost equal to the In composition, the Al composition is from 0 to 0.7 when the sum of the Al composition and the Ga composition is defined as 1. The active layer 53 has a MQW structure formed of a $Ga_{0.5}In_{0.5}P$ well layer and an $(Al_{0.5}Ga_{0.5})_{0.5}In_{0.5}P$ barrier layer. The maximum diameter a of the light emitting diode structure is 20 μm. Since the thicknesses of the n-GaAs layer 51, the n-AlGaInP layer 52, the active layer 53, the p-AlGaInP layer 54 and the p-GaAs layer 55 are 50 nm, 1000 nm, 900 nm, 1000 and 50 nm, respectively, the thickness of the entire light emitting diode structure is 50+1000+900+1000+50=3000 nm=3 μm. Accordingly, the aspect ratio of the light emitting diode structure is b/a=3/20=0.15. The angle $\theta_1$ is 45 degrees. When the refractive index of the transparent resin 16 is 1.6, and if the thickness thereof immediately after application is 1 μm in its flat part and the thickness is decreased to 70% due to cure shrinkage, the angle $\theta_2$ is 20 degrees. The p-electrode 15 is formed of a metal multilayer film with an Au/Pt/Au structure. The thicknesses of the Au, Pt and Au films are 50 nm, 50 nm and 2000 nm, respectively. The reflective film 17 is formed of an Au monolayer film and has a thickness of 100 nm. The n-electrode 18 is formed of a metal multilayer film with a Pd/AuGe/Au structure. The thicknesses of the Pd, AuGe and Au films are 10 nm, 90 nm and 2000 nm, respectively.

One example of a method of manufacturing the AlGaInP-based light emitting diode will be described below.

Figure 13A:
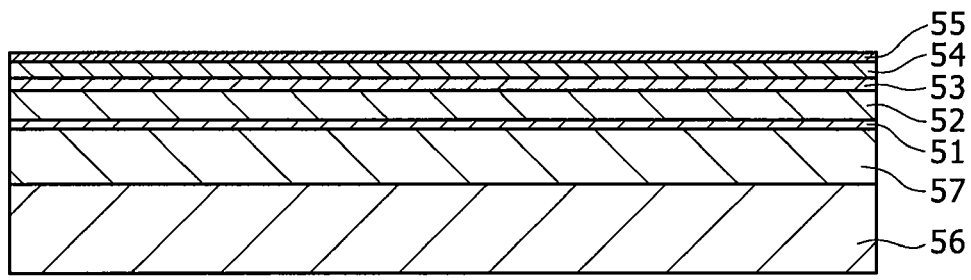
FIGS. 13A to 13F are sectional views for explaining a method of manufacturing the AlGaInP-based light emitting diode according to the fourth embodiment.

Referring initially to FIG. 13A, on an n-GaAs substrate 56 of which major face is the (001) plane or a plane offset the from (001) plane by about 10 degrees in the [100] direction and of which thickness is 350 μm, an n-AlGaInP etch-stop layer 57 is deposited to a thickness of 500 nm by MOCVD at a temperature of about 800° C. Subsequently, the n-GaAs layer 51, the n-AlGaInP layer 52, the active layer 53, the p-AlGaInP layer 54 and the p-GaAs layer 55 are sequentially grown over the layer 57.

Examples of growth materials for the AlGaInP-based semiconductor layers include trimethylgallium (($CH_3)_3Ga$, TMG) as a material for Ga, trimethylaluminum (($CH_3)_3Al$, TMA) as a material for Al, trimethylindium (($CH_3)_3In$, TMI) as a material for In, and phosphine ($PH_3$) as a material for P. As for dopants, hydrogen selenide ($H_2Se$) is used as the n-type dopant, and dimethylzinc (($CH_3)_2Zn$, DMZn) is used as the p-type dopant.

Subsequently, the n-GaAs substrate 56 over which the AlGaInP-based semiconductor layers have been grown as described above is brought out from the MOCVD apparatus.

Figure 13B:
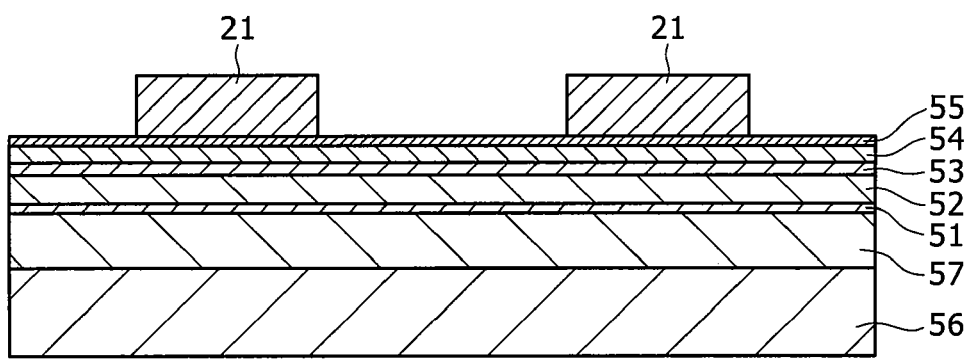

Referring next to FIG. 13B, circular resist patterns 21 are formed on the p-GaAs layer 55.

Figure 13C:
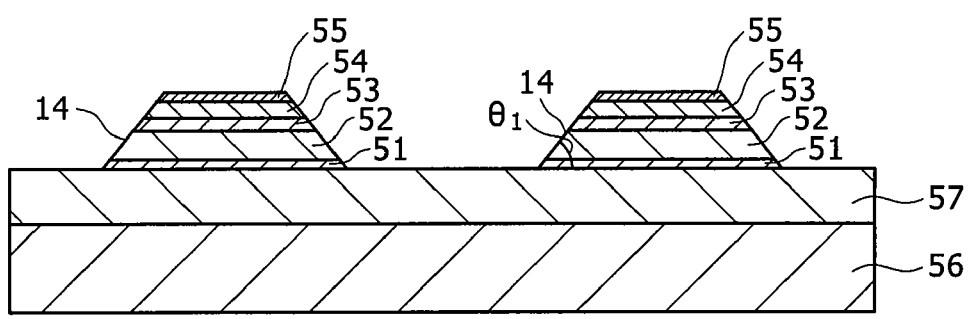

Next, by RIE employing the resist patterns 21 as the mask, etching is carried out under a condition offering taper etching until the n-GaAs layer 51 is etched, followed by removal of the resist patterns 21. In this manner, the end faces 14 with the inclination angle $\theta_1$ are formed as shown in FIG. 13C. This etching is stopped when the n-AlGaInP etch-stop layer 57 is exposed.

Figure 13D:
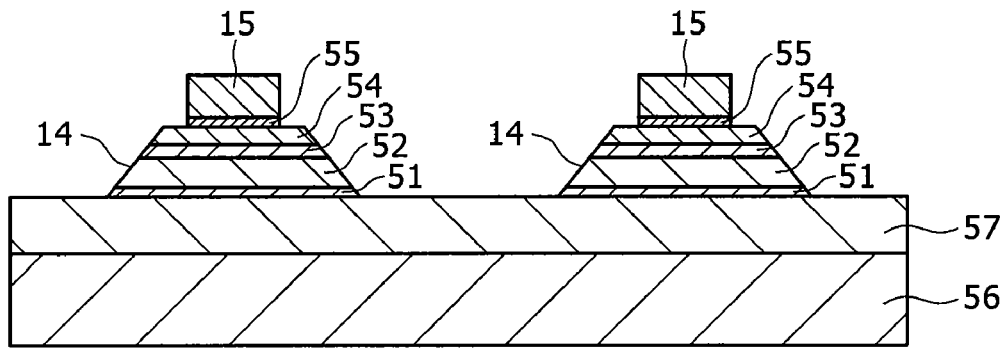

Next, a resist pattern with predetermined circular shapes is formed on the substrate surface by photolithography, and Au, Pt and Au films are sequentially formed on the entire substrate surface by sputtering, followed by removal (lift-off) of the resist pattern together with the Au, Pt and Au films thereon. Thus, as shown in FIG. 13D, the circular p-electrodes 15 of an Au/Pt/Au structure are formed on the p-GaAs layers 55. Subsequently, the p-GaAs layers 55 other than the layers 55 under the p-electrodes 15 are removed by etching.

Figure 13E:
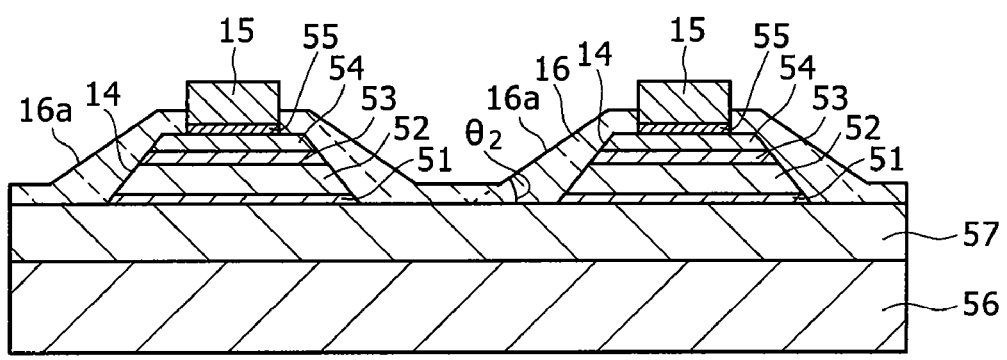

Referring next to FIG. 13E, the transparent resin 16 is formed. As the forming method of the transparent resin 16, the same methods as those in the first embodiment can be used.

Figure 13F:
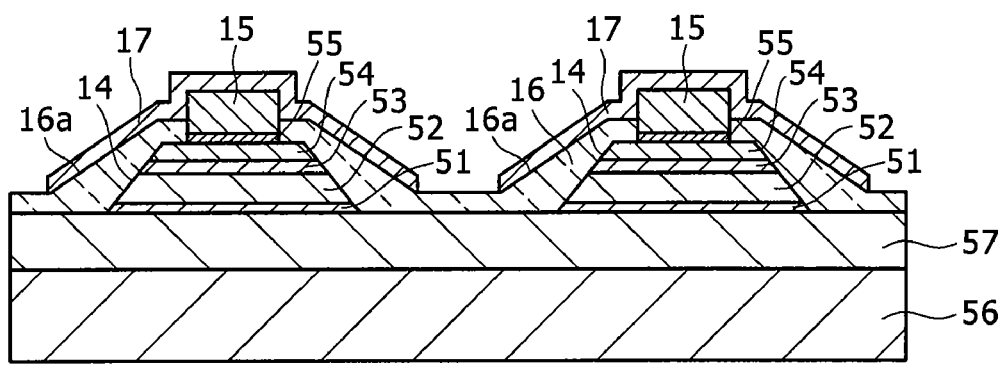

Next, an Au film is formed on the entire substrate surface by sputtering, and then a resist pattern with circular shapes is formed on the Au film by photolithography, followed by etching of the Au film with use of the resist pattern as the mask. Thus, as shown in FIG. 13F, the circular reflective films 17 formed of the Au monolayer film are formed on the transparent resin 16 and the p-electrodes 15.

Subsequently, another sapphire substrate (not shown) that is separately prepared is applied to the reflective films 17 with use of resin or the like, and then the n-GaAs substrate 56 is etch-removed by wet etching from the backside, followed by further etch-removal of the n-AlGaInP etch-stop layer 57. At this time, the respective AlGaInP-based light emitting diodes are isolated from each other.

Subsequently, resist patterns with predetermined circular shapes are formed on the surfaces of the n-GaAs layers 51 by photolithography, and Pd, AuGe and Au films are sequentially formed on the entire surfaces by sputtering, followed by removal (lift-off) of the resist patterns together with the Pd, AuGe and Au films thereon. Thus, the circular n-electrodes 18 with a Pd/AuGe/Au structure are formed on the n-GaAs layers 51. Thereafter, the n-GaAs layers 51 other than the layers 51 under the n-electrodes 18 are removed by etching.

Subsequently, the sapphire substrate applied to the reflective films 17 is removed so that the respective AlGaInP-based light emitting diodes are separated from each other.

Through the above-described steps, the intended AlGaInP-based light emitting diode shown in FIG. 12 is completed. The thus manufactured AlGaInP-based light emitting diode may be used alone as a single element, or alternatively may be applied to another substrate according to application. In addition, it may be transferred and may be coupled to interconnects.

Figure 14:
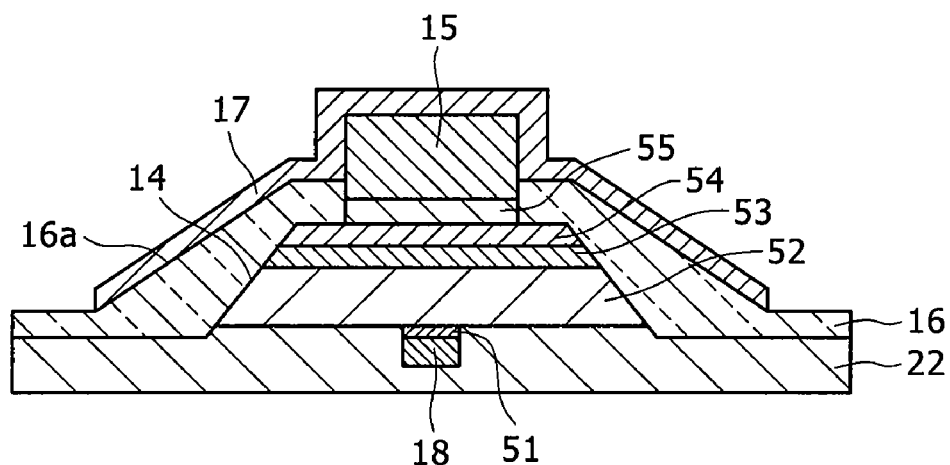
FIG. 14 is a sectional view illustrating the AlGaInP-based light emitting diode according to the fourth embodiment further including a transparent interconnect formed on an n-electrode.

FIG. 14 shows an example in which a transparent interconnect 22 composed of ITO or the like is formed on the back face of the n-AlGaInP layer 52 to cover the n-electrode 18.

The fourth embodiment allows an AlGaInP-based light emitting diode to achieve the same advantages as those of the first embodiment.

A fifth embodiment will be described below.

Figure 15:
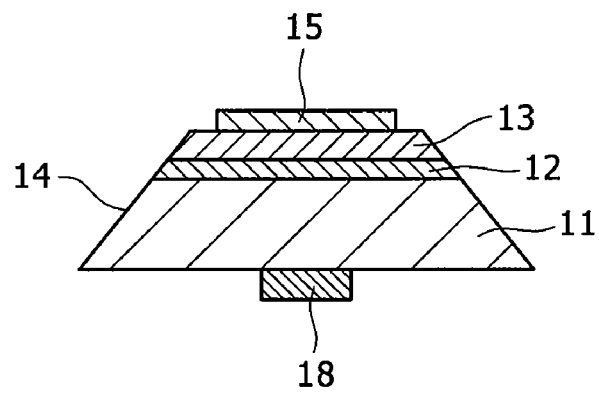
FIG. 15 is a sectional view illustrating a GaN-based light emitting diode according to a fifth embodiment.

FIG. 15 illustrates a GaN-based light emitting diode according to the fifth embodiment.

Referring to FIG. 15, in this GaN-based light emitting diode, an n-GaN layer 11, an active layer 12 thereon, and a p-GaN layer 13 thereon construct a light emitting diode structure. The n-GaN layer 11, the active layer 12 and the p-GaN layer 13 have e.g. a circular planar shape as a whole, and a section thereof perpendicular to a diameter direction thereof has a trapezoidal shape. An end face 14 is inclined to the major face of these layers. This inclination angle is the same as the angle 0(1 in the first embodiment. A p-electrode 15 having e.g. a circular shape is formed on the p-GaN layer 13. An n-electrode 18 having e.g. a circular shape is formed on the lower face of the n-GaN layer 11. The n-electrode 18 is formed on a region other than the region obtained by projecting the end face 14 on the lower face of the n-GaN layer 11, in other words, formed within the region obtained by projecting the upper face of the p-GaN layer 13 on the lower face of the n-GaN layer 11. Thus, most of light that is emanated from the active layer 12 and is reflected by the end face 14 downward is not blocked by the n-electrode 18 but extracted to the outside.

The fifth embodiment can enhance the light extraction efficiency, and thus can offer a GaN-based light emitting diode having high emission efficiency. Furthermore, this GaN-based light emitting diode is allowed to have an ultra small size of e.g. several tens of micrometers or less.

A sixth embodiment will be described below.

Figure 16:
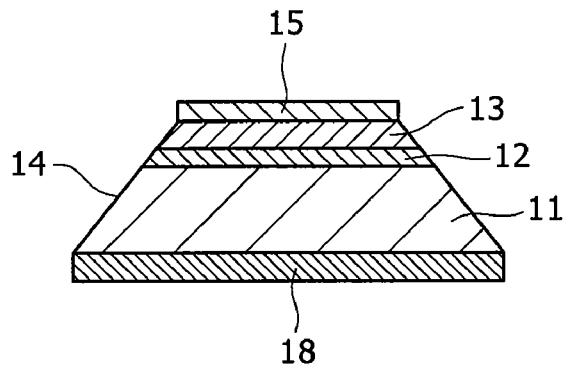
FIG. 16 is a sectional view illustrating a GaN-based light emitting diode according to a sixth embodiment.

FIG. 16 illustrates a GaN-based light emitting diode according to the sixth embodiment.

As shown in FIG. 16, in this GaN-based light emitting diode, a p-electrode 15 is formed on the entire upper face of a p-GaN layer 13. An n-electrode 18 is formed on the entire lower face of an n-GaN layer 11. As the material for both the p-electrode 15 and the n-electrode 18, a material having as high a reflectivity as possible for light with the emission wavelength, such as Ag or a metal composed mainly of Ag, is used. Other features of the sixth embodiment are the same as those of the fifth embodiment.

According to the sixth embodiment, light emanated from the active layer 12 is reflected by both the p-electrode 15 and the n-electrode 18, which can offer an increased amount of light extracted from the end face 14. This allows enhancement of the light extraction efficiency, and thus can offer a GaN-based light emitting diode having high emission efficiency. Furthermore, this GaN-based light emitting diode is allowed to have an ultra small size of e.g. several tens of micrometers or less.

A seventh embodiment will be described below.

Figure 17:
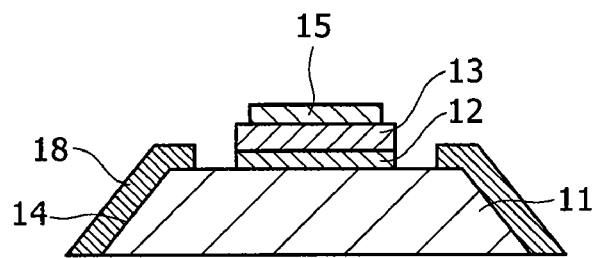
FIG. 17 is a sectional view illustrating a GaN-based light emitting diode according to a seventh embodiment.

FIG. 17 illustrates a GaN-based light emitting diode according to the seventh embodiment.

Referring to FIG. 17, in this GaN-based light emitting diode, an n-GaN layer 11, an active layer 12 thereon, and a p-GaN layer 13 thereon construct a light emitting diode structure. The n-GaN layer 11, the active layer 12 and the p-GaN layer 13 have e.g. a circular planar shape as a whole, and a section thereof perpendicular to a diameter direction thereof has an almost trapezoidal shape. An end face 14 of the n-GaN layer 11 is inclined to the major face thereof. This inclination angle is the same as the angle $\theta_1$ in the first embodiment. In the seventh embodiment, upper part of the n-GaN layer 11, the active layer 12 and the p-GaN layer 13 are patterned into e.g. a cylinder shape. A p-electrode 15 having e.g. a circular shape is formed on the p-GaN layer 13. An n-electrode 18 is formed to cover the end face 14 of the n-GaN layer 11. Both the p-electrode 15 and the n-electrode 18 are formed of a material, such as a metal having as high a reflectivity as possible for light with the emission wavelength. Since the n-electrode 18 is formed on the end face 14, light that is emanated from the active layer 12 and is incident on the end face 14 is efficiently reflected downward, followed by being extracted from the lower face of the n-GaN layer 11 to the external. Other features of the seventh embodiment are the same as those of the fifth embodiment.

The seventh embodiment can enhance the light extraction efficiency, and thus can offer a GaN-based light emitting diode having high emission efficiency. Furthermore, this GaN-based light emitting diode is allowed to have an ultra small size of e.g. several tens of micrometers or less.

An eighth embodiment will be described below.

Figure 18:
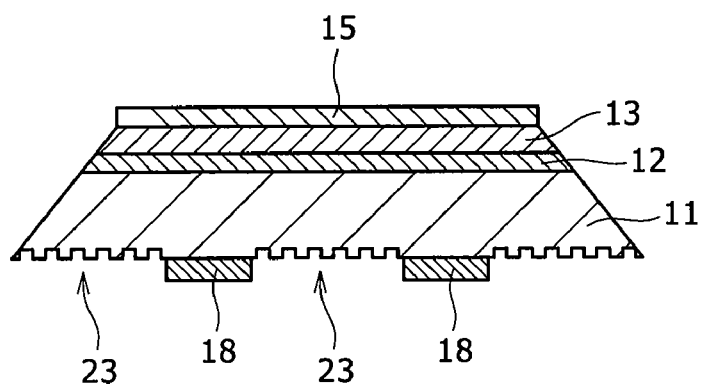
FIG. 18 is a sectional view illustrating a GaN-based light emitting diode according to an eighth embodiment.

FIG. 18 illustrates a GaN-based light emitting diode according to the eighth embodiment.

As shown in FIG. 18, in this GaN-based light emitting diode, a p-electrode 15 is formed on the entire upper face of a p-GaN layer 13. On the back face of an n-GaN layer 11, an n-electrode 18 with a ring shape is formed within the region obtained by projecting the upper face of the p-GaN layer 13 on the lower face of the n-GaN layer 11. On the back face of the n-GaN layer 11 other than the region on which the n-electrode 18 is formed, a photonic crystal is formed that is composed of regularly formed small recesses and projections 23 and allows efficient extraction of light with the emission wavelength to the outside. The size and distance of the recesses and projections 23 are e.g. about 0.1 to 1 µm. Other features of the eighth embodiment are the same as those of the fifth embodiment.

According to the eighth embodiment, light that is emanated from the active layer 12 and reaches the lower face of the n-GaN layer 11 can be extracted to the external efficiently due to the photonic crystal composed of the recesses and projections 23. Thus, the light extraction efficiency can be enhanced, which can offer a GaN-based light emitting diode having high emission efficiency. Furthermore, this GaN-based light emitting diode is allowed to have an ultra small size of e.g. several tens of micrometers or less.

A description will be made below about a guide for decision of the position, shape and size of an n-electrode 18 with respect to an active layer 12 that does not have a circular planar shape but has any other shape unlike the above-described embodiments.

Figure 19A:
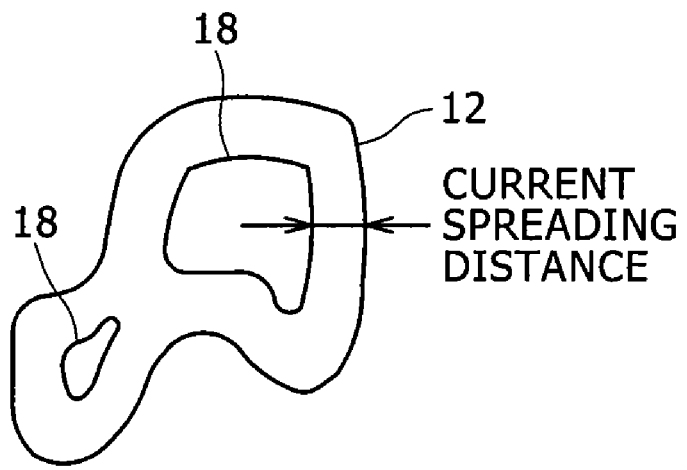
FIGS. 19A and 19B are schematic diagrams for explaining a guide for decision of the position, shape and size of an n-electrode when an active layer has any shape.
Figure 19B:
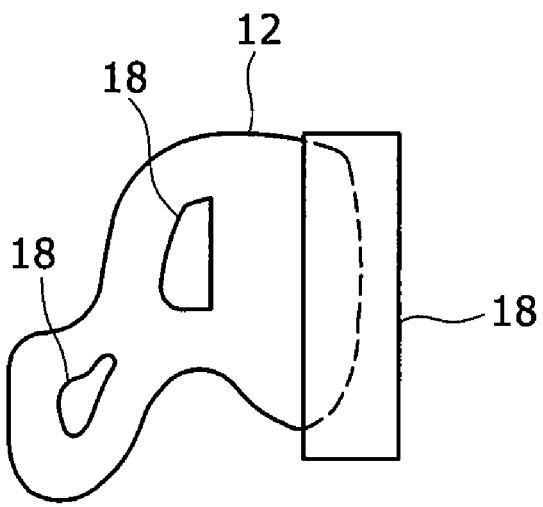

The following discussion is based on an assumption that the active layer 12 has a planar shape like one illustrated in FIG. 19A. When in the operation of a GaN-based light emitting diode, a forward voltage is applied between a p-electrode 15 and an n-electrode 18 so that a current flows from the p-electrode 15 to the n-electrode 18, the width of the current passing through the active layer 12 is larger than that of the n-electrode 18 due to current spreading in the lateral direction (refer to e.g. H. C. Casey, Jr. & M. B. Panish; Heterostructure Lasers, Part A, B, Academic Press, 1978, FIG. 7. 7-1 and the related explanations). Therefore, it is desirable that the n-electrode 18 is at least as large as the region obtained by shrinking the active layer 12 by the current spreading distance as shown in FIG. 19A. In other words, it is desirable that the region arising from outward extension of the n-electrode 18 by the current spreading distance completely corresponds with the active layer 12 or completely encompasses the active layer 12. As long as this condition is satisfied, the n-electrode 18 may be divided into three portions as shown in FIG. 19B for example. In addition, in terms of the contact resistance of the n-electrode 18, the following condition needs to be satisfied: (contact resistance Rc [$\Omega cm^2$] of the n-electrode 18)/(required contact resistance R [$\Omega$])$\leq$ (contact area [$cm^2$] of the n-electrode 18).

The embodiments of the invention have been specifically described above. However, it should be noted that the invention is not limited the above-described embodiments but various modifications based on the technical idea of the invention might be incorporated.

For example, numbers, materials, structures, shapes, substrates, ingredients, processes and so forth cited in the first to eighth embodiments are merely examples. Different numbers, materials, structures, shapes, substrates, ingredients, processes and so forth may be used according to need.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light emitting diode comprising:
   a semiconductor layer that forms a light emitting diode structure and has a light extraction plane and an end face inclined at an angle $\theta_1$ to the light extraction plane;
   a reflector that is provided outside and opposed to the end face, and includes at least an inner surface inclined at an angle $\theta_2$ to the light extraction plane, the angle $\theta_2$ being smaller than the angle $\theta_1$; and
   a transparent resin that is formed between the end face and the reflector, the transparent resin including a first surface corresponding to the end face of the semiconductor layer, a second surface corresponding to the inner surface of the reflector, and a third surface that is coplanar with the light extraction plane.

2. The light emitting diode according to claim 1, wherein the transparent resin has a refractive index smaller than a refractive index of the semiconductor layer.

3. The light emitting diode according to claim 1, wherein a thickness of the semiconductor layer ranges from about 0.3 μm to 10 μm, and a ratio of the thickness of the semiconductor layer to a maximum diameter of the semiconductor layer ranges from about 0.001 to about 2 inclusive.

4. The light emitting diode according to claim 1, further comprising a first electrode and a second electrode that are provided on the light extraction plane of the semiconductor layer and on a plane of the semiconductor layer opposite to the light extraction plane, respectively, the reflector forming an ohmic contact with the second electrode and serving also as part of the second electrode or part of an interconnect coupled to the second electrode.

5. The light emitting diode according to claim 1, wherein if the angle $\theta_1$ is in a range of $30° \leq \theta_1 \leq 90°$, the reflector covers at least a region obtained by projecting the end face on a plane on which the reflector is formed in a direction perpendicular to the end face, and if the angle $\theta_1$ is in a range of $90° < \theta_1 \leq 150°$, the reflector covers at least a region obtained by projecting the end face on the plane on which the reflector is formed in a direction arising from mirror reflection of the direction perpendicular to the end face about the light extraction plane of the semiconductor layer.

6. The light emitting diode according to claim 1, wherein the reflector extends over a plane of the semiconductor layer opposite to the light extraction plane of the semiconductor layer.

7. The light emitting diode according to claim 2, wherein if the angle $\theta_1$ is in a range of $30° \leq \theta_1 \leq 90°$, the angles $\theta_1$ and $\theta_2$ satisfy inequalities $\theta_2 \geq (\theta_1 - \sin^{-1}(n_3/n_2))/2$ and $\theta_2 \leq \theta_1/2$, and if the angle $\theta_1$ is in a range of $90° < \theta_1 \leq 150°$, the angles $\theta_1$ and $\theta_2$ satisfy inequalities $\theta_2 \geq ((\theta_1 - 90) - \sin^{-1}(n_3/n_2))/2$ and $\theta_2 \leq (\theta_1 - 90)/2$, where $n_2$ is a refractive index of the transparent resin and $n_3$ is a refractive index of a medium outside the transparent resin.

8. The light emitting diode according to claim 1, wherein a reflective plane of the reflector has a curved surface part.

9. The light emitting diode according to claim 1, further comprising a first electrode and a second electrode that are provided on the light extraction plane of the semiconductor layer and on a plane of the semiconductor layer opposite to the light extraction plane, respectively, the first electrode being formed on a region other than a region obtained by projecting the end face on the light extraction plane of the semiconductor layer in a direction perpendicular to the light extraction plane.

10. A light emitting diode comprising:
   a semiconductor layer that forms a light emitting diode structure and has a light extraction plane and an end face inclined to the light extraction plane;
   a reflector that is provided outside and opposed to the end face, and includes at least an inner surface inclined at an angle;
   a transparent resin that is formed between the end face and the reflector, the transparent resin including a first surface corresponding to the end face of the semiconductor layer, a second surface corresponding to the inner surface of the reflector, and a third surface that is coplanar with the light extraction planet; and
   a first electrode and a second electrode that are opaque and are formed on the semiconductor layer, the second electrode being provided on the light extraction plane of the semiconductor layer, the first electrode being provided on a region other than a region overlapping with a light path in which an amount of light extracted from the semiconductor layer is large.

11. A light emitting diode backlight including a plurality of arranged light emitting diodes for emitting red light, a plurality of arranged light emitting diodes for emitting green light, and a plurality of arranged light emitting diodes for emitting blue light; at least one light emitting diode comprising:
- a semiconductor layer that forms a light emitting diode structure and has a light extraction plane and an end face inclined at an angle $\theta_1$ to the light extraction plane; and
- a reflector that is provided outside and opposed to the end face, and includes at least an inner surface inclined at an angle $\theta_2$ to the light extraction plane, the angle $\theta_2$ being smaller than the angle $\theta_1$; and
- a transparent resin that is formed between the end face and the reflector, the transparent resin including a first surface corresponding to the end face of the semiconductor layer, a second surface corresponding to the inner surface of the reflector, and a third surface that is coplanar with the light extraction plane.

12. A light emitting diode illuminating device including a plurality of arranged light emitting diodes for emitting red light, a plurality of arranged light emitting diodes for emitting green light, and a plurality of arranged light emitting diodes for emitting blue light, at least one light emitting diode comprising:
- a semiconductor layer that forms a light emitting diode structure and has a light extraction plane and an end face inclined at an angle $\theta_1$ to the light extraction plane;
- a reflector that is provided outside and opposed to the end face, and includes at least an inner surface inclined at an angle $\theta_2$ to the major face, the angle $\theta_2$ being smaller than the angle $\theta_1$; and
- a transparent resin that is formed between the end face and the reflector, the transparent resin including a first surface corresponding to the end face of the semiconductor layer, a second surface corresponding to the inner surface of the reflector, and a third surface that is coplanar with the light extraction plane.

13. A light emitting diode display including a plurality of arranged light emitting diodes for emitting red light, a plurality of arranged light emitting diodes for emitting green light, and a plurality of arranged light emitting diodes for emitting blue light, at least one light emitting diode comprising:
- a semiconductor layer that forms a light emitting diode structure and has a light extraction plane and an end face inclined at an angle $\theta_1$ to the light extraction plane;
- a reflector that is provided outside and opposed to the end face, and includes at least an inner surface inclined at an angle $\theta_2$ to the light extraction plane, the angle $\theta_2$ being smaller than the angle $\theta_1$; and
- a transparent resin that is formed between the end face and the reflector, the transparent resin including a first surface corresponding to the end face of the semiconductor layer, a second surface corresponding to the inner surface of the reflector, and a third surface that is coplanar with the light extraction plane.

14. An electronic apparatus including at least one light emitting diode, the light emitting diode comprising:
- a semiconductor layer that forms a light emitting diode structure and has a light extraction plane and an end face inclined at an angle $\theta_1$ to the light extraction plane; and
- a reflector that is provided outside and opposed to the end face, and includes at least an inner surface inclined at an angle $\theta_2$ to the light extraction plane, the angle $\theta_2$ being smaller than the angle $\theta_1$; and
- a transparent resin that is formed between the end face and the reflector, the transparent resin including a first surface corresponding to the end face of the semiconductor layer, a second surface corresponding to the inner surface of the reflector, and a third surface that is coplanar with the light extraction plane.

* * * * *